United States Patent
Lin et al.

(10) Patent No.: US 6,834,766 B2
(45) Date of Patent: Dec. 28, 2004

(54) EXPANSION CARD MOUNTING APPARATUS

(75) Inventors: Kuo-Chih Lin, Tu-chen (TW); Quan-guang Du, Shenzhen (CN); Li Tong, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 16 days.

(21) Appl. No.: 10/324,171

(22) Filed: Dec. 18, 2002

(65) Prior Publication Data

US 2004/0074854 A1 Apr. 22, 2004

(30) Foreign Application Priority Data

Oct. 18, 2002 (TW) .......................................... 91216626

(51) Int. Cl.⁷ .............................. A47F 5/00; H05K 7/14
(52) U.S. Cl. .................... 211/41.17; 361/683; 361/759
(58) Field of Search .................... 211/41.17; 361/759, 361/825, 683, 684, 686, 682, 732, 726, 747

(56) References Cited

U.S. PATENT DOCUMENTS

| 5,757,618 | A | * | 5/1998 | Lee | 361/686 |
| 5,936,835 | A | * | 8/1999 | Astier | 361/683 |
| 5,947,571 | A | * | 9/1999 | Ho | 312/265.6 |
| 6,231,139 | B1 | * | 5/2001 | Chen | 312/223.2 |
| 6,442,038 | B1 | * | 8/2002 | Erickson et al. | 361/759 |
| 6,480,393 | B1 | * | 11/2002 | Chen | 361/759 |
| 6,487,070 | B2 | * | 11/2002 | Gan | 361/683 |
| 6,530,629 | B2 | * | 3/2003 | Shyr | 312/223.2 |
| 6,549,398 | B2 | * | 4/2003 | Chen | 361/683 |
| 6,674,650 | B1 | * | 1/2004 | Davis et al. | 361/796 |
| 6,693,800 | B1 | * | 2/2004 | Lin et al. | 361/759 |

* cited by examiner

Primary Examiner—Robert W. Gibson, Jr.
(74) Attorney, Agent, or Firm—Wei Te Chung

(57) ABSTRACT

An expansion card mounting apparatus includes a rear panel (20) defining an opening (21), a retaining bracket (10) including a main body (16) and a pressing body (12) extending perpendicularly from the main body, and a fastening member (30). A support plate (22) extends outwardly from the rear panel adjacent the opening. The retaining bracket is slidably engaged with the rear panel at the opening. A through opening (162) and two catch openings (164) are defined in the main body. The fastening member includes two spring fingers (38) engaging in the catch openings, and a resilient clip (36) extending through the through opening and engaging with the rear panel at the opening. The pressing body of the retaining bracket is thereby pushed toward the support plate by the clip, and securely sandwiches an end portion (524) of a slot cover (52) of an expansion card (50) with the support plate.

18 Claims, 5 Drawing Sheets

EXPANSION CARD MOUNTING APPARATUS

BACKGROUND OF THE INVENTION

1. Field of the Invention

The present invention relates to mounting apparatuses, and more particularly to a mounting apparatus for readily and securely mounting expansion cards in a computer enclosure.

2. Related Art

Many computer systems comprise not only a motherboard, but also one or more expansion cards which provide specialized functions. Such expansion cards each typically comprise a rectangular printed circuit board (PCB) and a metallic slot cover attached along an end edge of the PCB. The slot cover has an outwardly bent end portion. When an expansion card is installed in a computer enclosure, the end portion abuts a support plate formed at a rear panel of the enclosure. A cutout defined in the end portion coincides with a hole defined in the support plate. A screw or a bolt is extended through the cutout and engaged in the hole. The slot cover is thus secured to the support plate.

When installing or removing several expansion cards, using fasteners such as screws or bolts is laborious and time-consuming. In addition, a tool such as a screwdriver or a wrench is usually required. It is desired to eliminate said fasteners, by instead providing other retaining devices to hold the expansion cards in place.

SUMMARY OF THE INVENTION

Accordingly, an object of the present invention is to provide an apparatus for easy and quick installation and removal of expansion cards to and from equipment such as a computer enclosure.

To achieve the above-mentioned object, an expansion card mounting apparatus in accordance with a preferred embodiment of the present invention comprises a rear panel, a retaining bracket and a fastening member for fastening the retaining bracket to the rear panel. The expansion card comprises a slot cover at an end edge thereof. The slot cover has an outwardly bent end portion. The rear panel defines an opening in one side portion thereof. A support plate extends outwardly from the rear panel adjacent the opening. A pair of latch slots is defined in the rear panel near the opening. The retaining bracket comprises a main body having a pair of latches engaging in the latch slots of the rear panel, and a pressing body extending perpendicularly from one edge of the main body. A through opening and a pair of catch openings are defined in the main body. The fastening member comprises a pair of spring fingers engaging in the catch openings respectively, and a resilient clip extending through the through opening of the retaining bracket and engaging with the rear panel at the opening. The pressing body of the retaining bracket is thereby pushed toward the support plate by the clip, and securely sandwiches the end portion of the slot cover with the support plate of the rear panel.

Other objects, advantages and novel features of the present invention will be drawn from the following detailed description of the preferred embodiment of the present invention with attached drawings, in which:

DESCRIPTION OF THE PREFERRED EMBODIMENT

The present invention will be described in its preferred embodiment, and in conjunction with an expansion card.

Figure 1:
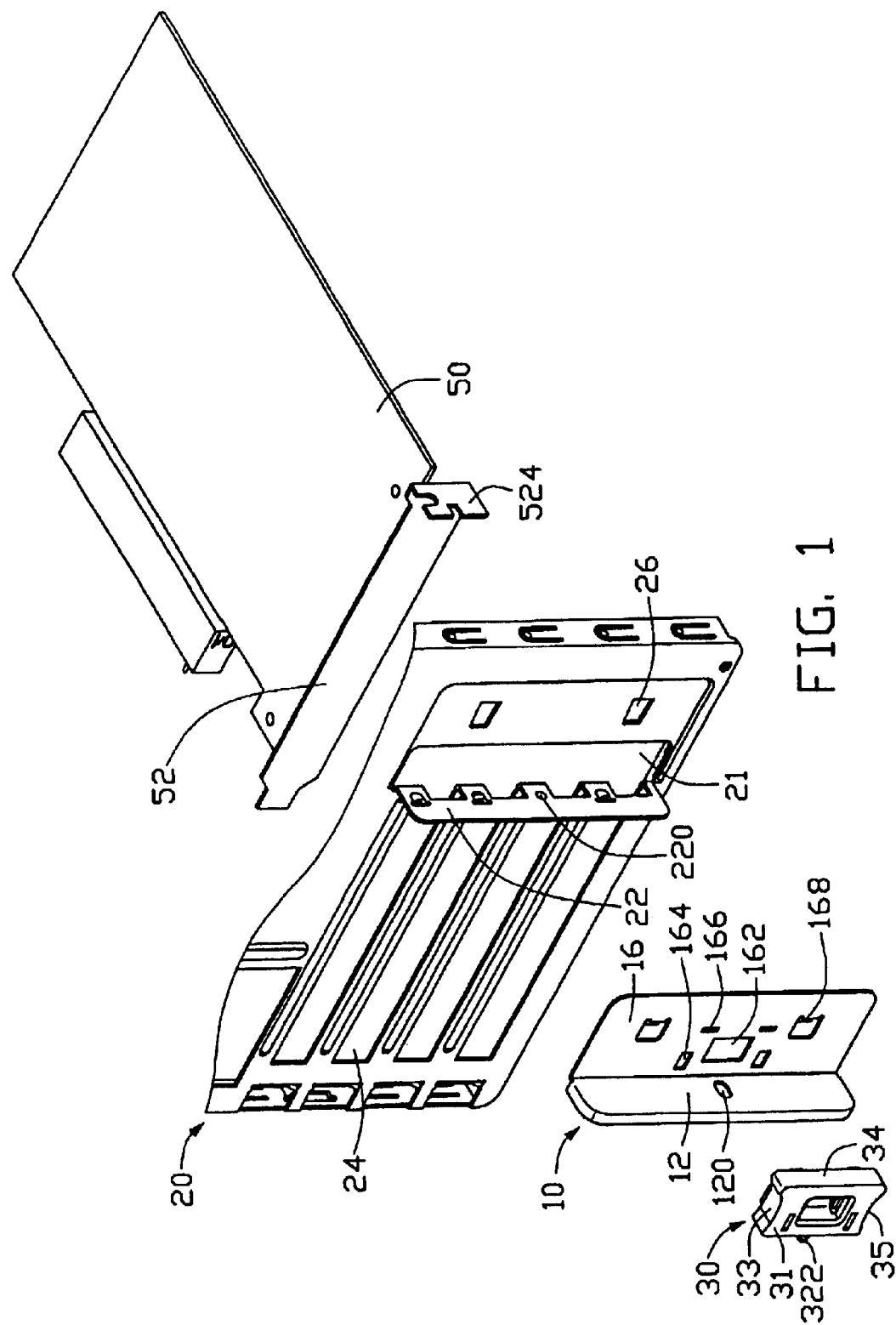
FIG. 1 is an exploded, isometric view of an expansion card mounting apparatus in accordance with a preferred embodiment of the present invention, together with an expansion card, the expansion card mounting apparatus comprising a rear panel, a retaining bracket, and a fastening member.
Figure 2:
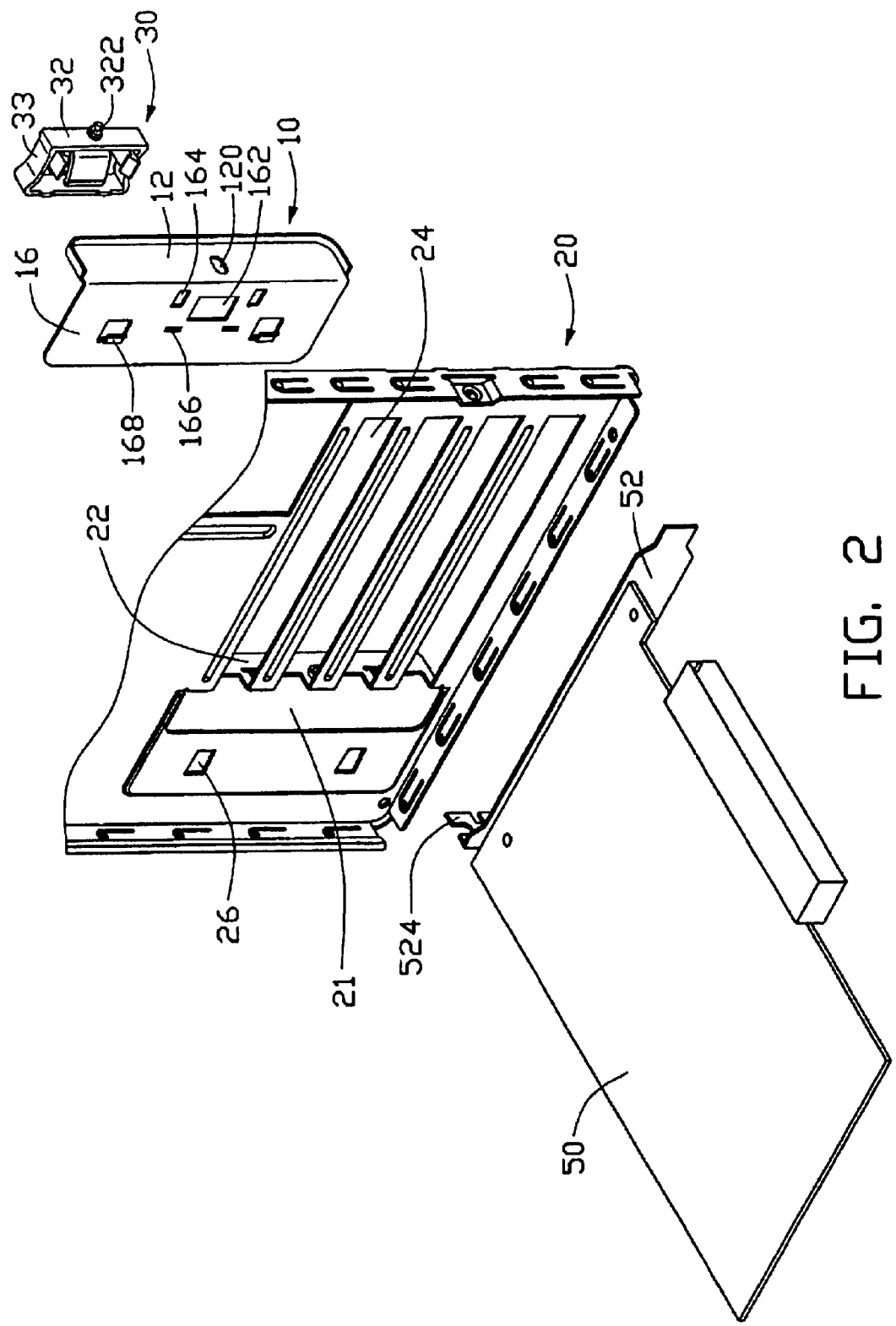
FIG. 2 is similar to FIG. 1, but viewed from another aspect.

FIGS. 1 and 2 show an expansion card mounting apparatus in accordance with the preferred embodiment of the present invention, together with an expansion card 50. The mounting apparatus comprises a rear panel 20, a retaining bracket 10, and a fastening member 30 for fastening the retaining bracket 10 to the rear panel 20.

The expansion card 50 comprises a slot cover 52 attached at one end thereof. The slot cover 52 comprises an end portion 524 bent perpendicularly outwardly from one end thereof.

The rear panel 20 defines a rectangular opening 21 in one side portion thereof. A vertical support plate 22 extends perpendicularly outwardly from the rear panel 20 adjacent the opening 21. The support plate 22 is for supporting the end portion 524 of the slot cover 52. A fastening hole 220 is defined in a middle portion of the support plate 20. A plurality of evenly spaced horizontal expansion slots 24 is defined in the rear panel 20, each in communication with one side of the opening 21. Each expansion slot 24 can receive the slot cover 52 thereat. A pair of vertically spaced latch slots 26 is defined in a recessed part of the rear panel 20 that is adjacent an opposite side of the opening 21.

The retaining bracket 10 comprises a main body 16, and a pressing body 12 extending perpendicularly outwardly from one edge of the main body 16. A mounting hole 120 is defined in a middle portion of the pressing body 12, corresponding to the fastening hole 220 of the rear panel 20. A through opening 162 is defined in a middle portion of the main body 16. A pair of catch openings 164 is defined in the main body 16 near the pressing body 12, generally above and below the through opening 162 respectively. A pair of vertically spaced apertures 166 is defined in a middle portion of the main body 16, respectively near corners of the through opening 162. A pair of latches 168 is inwardly stamped from top and bottom portions of the main body 16 respectively. The latches 168 have predetermined lengths, and are for engaging in the latch slots 26 of the rear panel 20 so as to latch the retaining bracket 10 on the rear panel 20.

Figure 3:
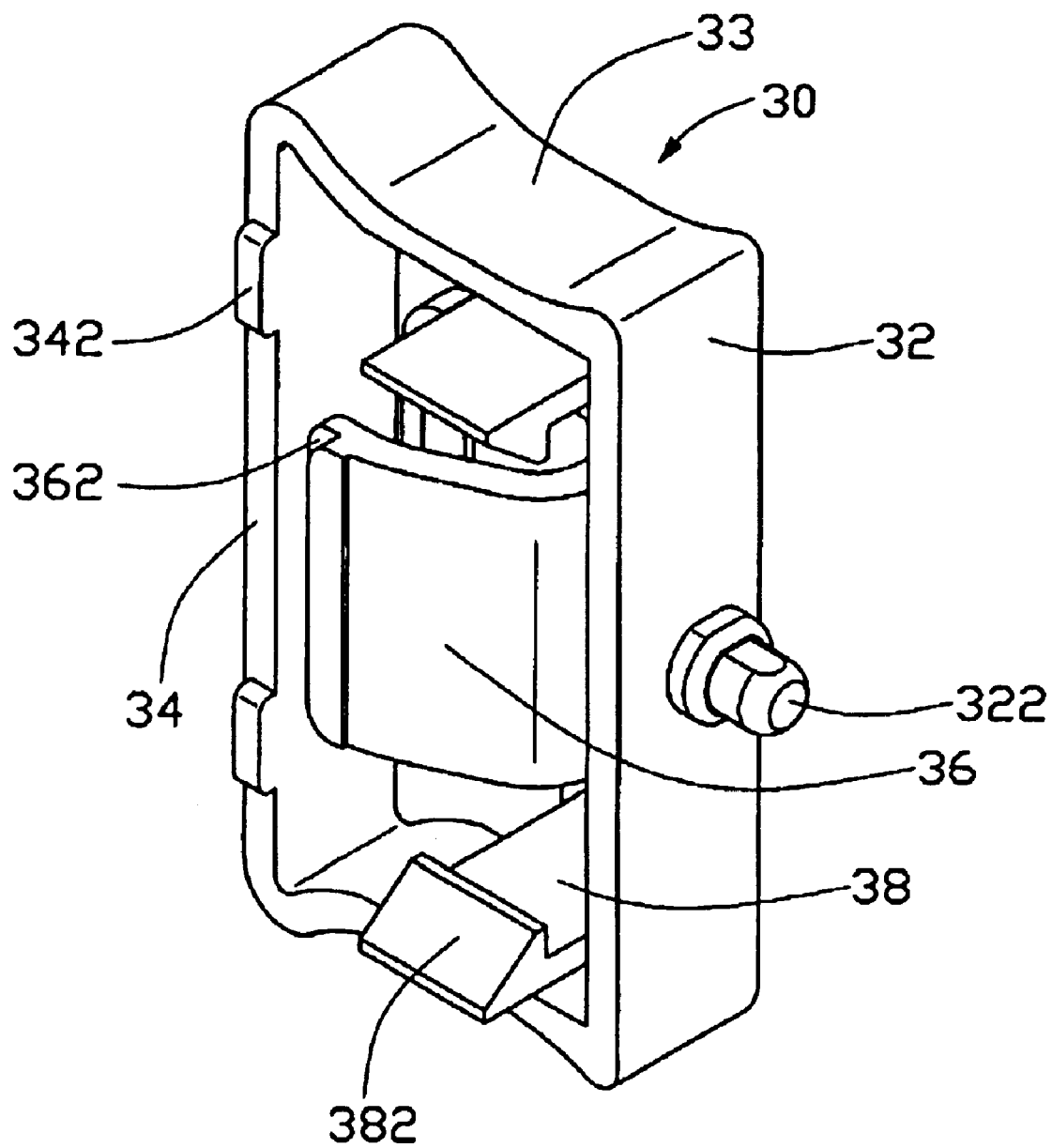
FIG. 3 is an enlarged, isometric view of the fastening member of the expansion card mounting apparatus of FIG. 1.

The fastening member 30 is made of resilient material such as plastic. The fastening member 30 comprises a base wall 31, and four side walls 32, 33, 34, 35 extending from four sides of the base wall 31 respectively. Referring also to FIG. 3, the side wall 32 outwardly forms a fastening pin 322 from a middle portion thereof. The side wall 34 forms a pair of spaced protrusions 342 on a free edge thereof. The protrusions 342 are for engaging in the apertures 166 of the retaining bracket 10 respectively. A resilient clip 36 obliquely extends from the base wall 31 into a central cavity of the fastening member 30. The clip 36 forms a step 362 at a free end thereof. A pair of resilient spring fingers 38 extends from the base wall 31 into the central cavity of the fastening member 30, at top and bottom sides of the clip 36 respectively. Each spring finger 38 forms a catch 382 at a free end thereof.

Figure 4:
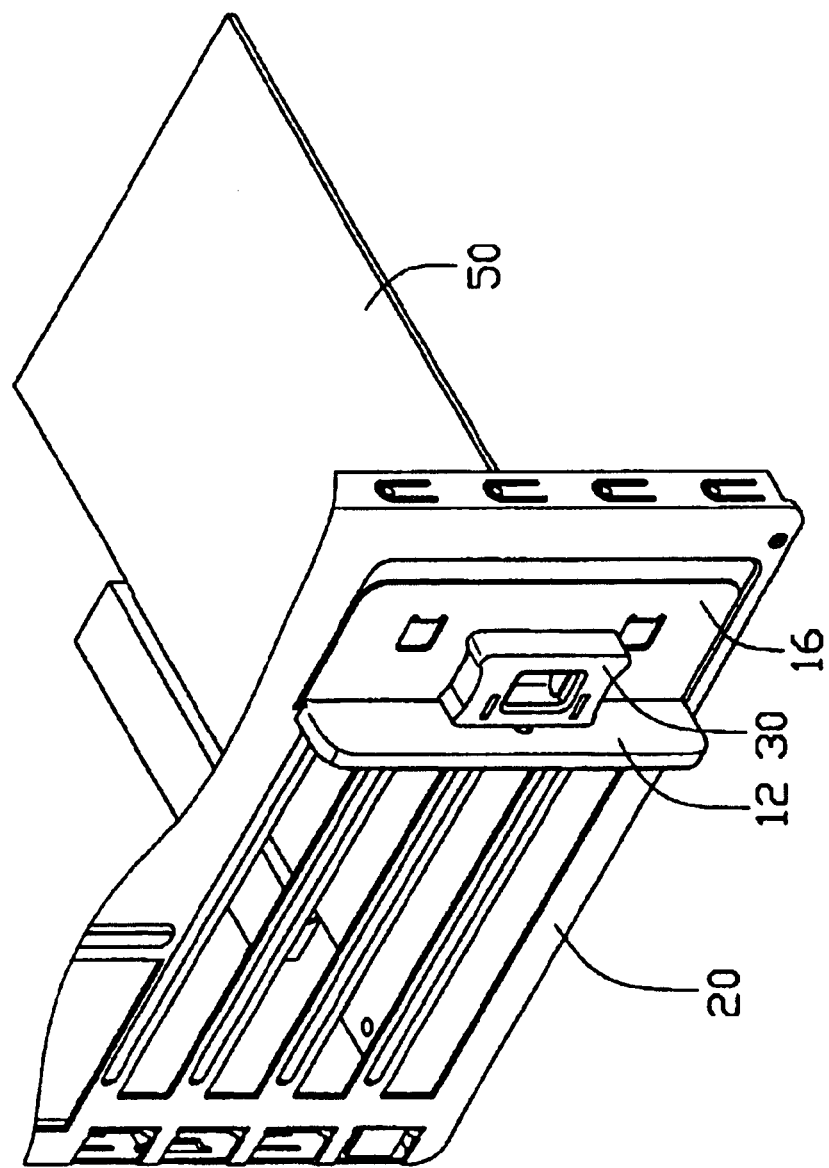
FIG. 4 is an assembled view of FIG. 1.
Figure 5:
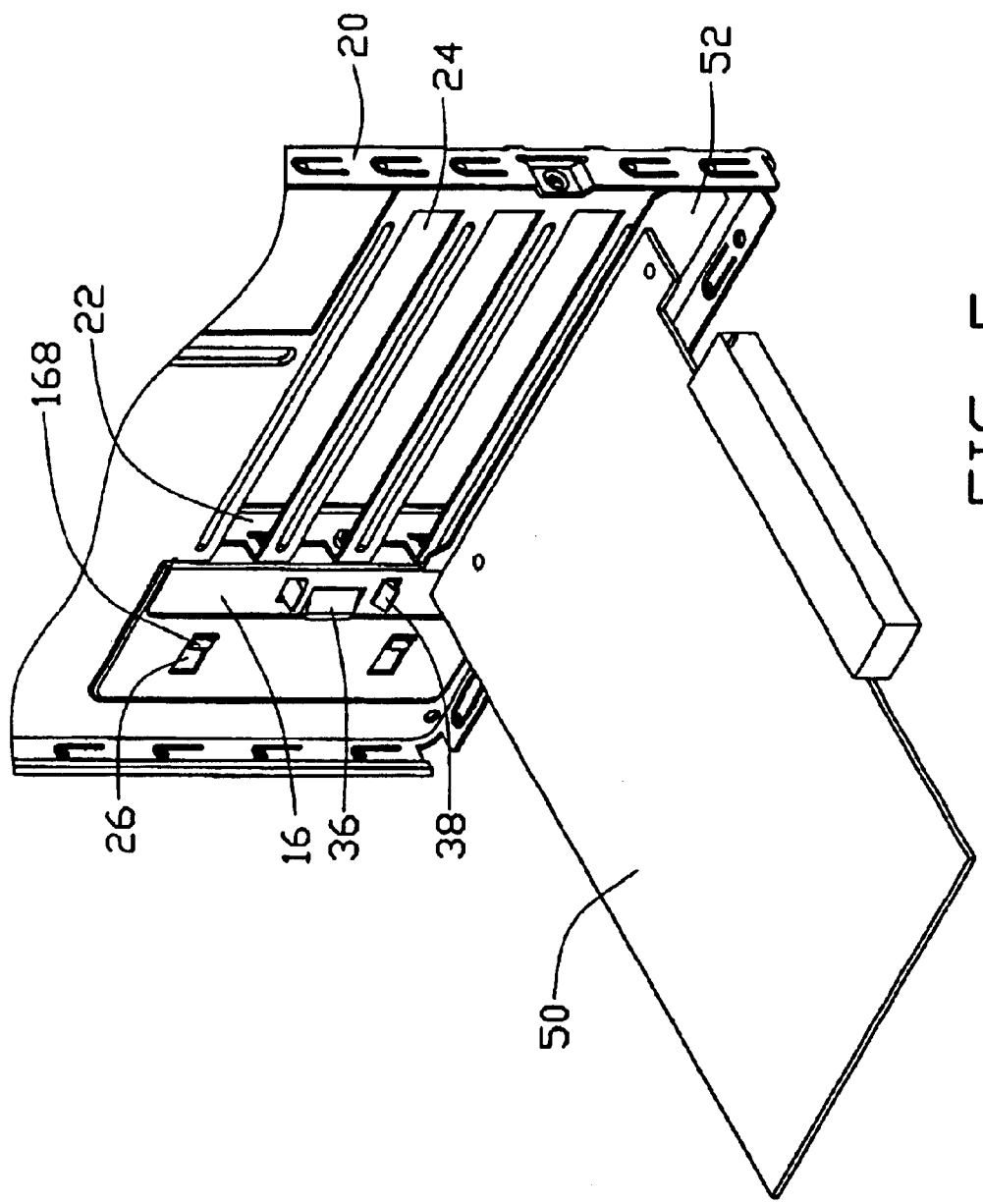
FIG. 5 is similar to FIG. 4, but viewed from another aspect.

Referring to FIGS. 4 and 5, in assembly, the retaining bracket 10 is placed to cover the opening 21 of the rear panel 20. The latches 168 of the main body 16 of the retaining bracket 10 are engaged in the latch slots 26 of the rear panel 20. Because of the predetermined lengths of the latches 168, the retaining bracket 10 can be slid relative to the rear panel 20 in horizontal directions without being disengaged from the rear panel 20.

The retaining bracket 10 is then slid slightly away from the support plate 22 of the rear panel 20. A space is created between the support plate 22 and the pressing body 12 of the retaining bracket 10. The expansion card 50 is attached to a motherboard (not shown). The slot cover 52 of the expansion card 50 is received at one of the expansion slots 24 of the rear panel 20, and the end portion 524 of the slot cover 52 is seated in the space between the support plate 22 and the pressing body 12. The retaining bracket 10 is slid toward the support plate 22 to press the end portion 524 on the support plate 22. The mounting hole 120 of the pressing body 12 is aligned with the fastening hole 220 of the support plate 22. The through opening 162 of the main body 16 coincides with the opening 21 of the rear panel 20.

Finally, the fastening member 30 is placed against the retaining bracket 10. The fastening pin 322 is extended into the mounting hole 120 of the pressing body 12 and the fastening hole 220 of the support plate 22. The fastening member 30 is pushed against the main body 16 of the retaining bracket 10. The spring fingers 38 are extended through the catch openings 164 of the main body 16, and the catches 382 of the spring fingers 38 are snappingly engaged with the main body 16 at the catch openings 164. The protrusions 342 of the side wall 34 are engagingly received in the apertures 166 of the main body 16. The resilient clip 36 is extended through the through opening 162 of the main body 16, and the step 362 of the clip 36 is resiliently engaged with the recessed part of the rear panel 20 at the opening 21. The clip 36 is therefore resiliently engaged between the recessed part of the rear panel 20 and the pressing body 12. Thus the end portion 524 of the slot cover 52 is securely sandwiched between the pressing body 12 and the support plate 22.

To remove the expansion card 50, the spring fingers 38 are bent in opposite directions away from each other, so that the catches 382 are released from the main body 16 at the catch openings 164. The free end of the clip 36 is pushed outwardly to disengage the step 362 from the recessed part of the rear panel 20 at the opening 21. The fastening member 30 is removed from the retaining bracket 10. The retaining bracket 10 is slid slightly away from the support plate 22. The slot cover 52 of the expansion card 50 is removed from the expansion slot 24 of the rear panel 20. Simultaneously, the expansion card 50 is removed from the motherboard.

In the expansion card mounting apparatus of the present invention, the slot cover 52 of the expansion card 50 is received in the expansion slot 24 of the rear panel 20. The end portion 524 of the slot cover 52 is retained between the support plate 22 of the rear panel 20 and the pressing body 12 of the retaining bracket 10 by resilient force of the clip 36 of the fastening member 30. Thus, the slot cover 52 is securely received in the rear panel 20. Accordingly, the expansion card 50 is reliably mounted to the motherboard of the computer enclosure.

In addition, the retaining bracket 10 is slidably attached to the rear panel 20. When removing or installing the expansion card 50, it is not necessary to remove the retaining bracket 10. This allows quick and convenient removal and installation of the expansion card 50.

Although only one expansion card 50 is included in the above description, the expansion card mounting apparatus of the present invention is equally capable of mounting a plurality of expansion cards 50 at the same time.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A mounting apparatus for expansion cards, each of the expansion cards comprising a slot cover having an outwardly bent end portion, the mounting apparatus comprising:

a panel defining an opening, and a plurality of slots for receiving the slot covers, the panel comprising a support member arranged adjacent the opening and adapted for supporting the end portions of the slot covers;

a retaining bracket slidably attached to the panel, the retaining bracket comprising a main body covering the opening of the panel, and a pressing body extending from one edge of the main body, the main body defining a through opening coinciding with the opening of the panel, and a pair of catch openings; and a fastening member comprising a pair of catch means engaging in the catch openings, and a clip extending through the through opening to abut against the panel at the opening, whereby the retaining bracket is pressed toward the support member by said clip so that the pressing body securely sandwiches the end portions of the slot covers with the support member.

2. The mounting apparatus as described in claim 1, wherein the panel defines a pair of latch slots, and the main body of the retaining bracket comprises a pair of latches movably engaging in the latch slots.

3. The mounting apparatus as described in claim 1, wherein the fastening member further comprises a base wall and four side walls extending from four sides of the base wall.

4. The mounting apparatus as described in claim 3, wherein each of the pressing body of the retaining bracket and the support member of the panel defines a hole therein, and the fastening member further comprises a fastening pin extending from one of the side walls into the holes of the pressing body and the support member.

5. The mounting apparatus as described in claim 4, wherein the fastening member further comprises a plurality of protrusions on one of the side walls, and the main body of the retaining bracket defines a plurality of apertures engagingly receiving the protrusions.

6. The mounting apparatus as described in claim 3, wherein said clip obliquely extends from the base wall into a middle of the fastening member, and comprises a detent means at a free end thereof engaging with the panel at the opening.

7. The mounting apparatus as described in claim 6, wherein the catch means comprises a pair of resilient spring fingers extending from the base wall, and each of the spring fingers comprises a catch at a free end thereof engaging with the retaining bracket at a corresponding catch opening.

8. A mounting apparatus assembly comprising:

a panel defining an opening, comprising a perpendicular support member at one side of the opening, and further comprising a pair of latch slots near an opposite side of the opening;

a retaining bracket located at the opening, the retaining bracket comprising a pair of latches movably engaged in the latch slots, respectively;

an expansion card comprising a slot cover having an outwardly bent end portion disposed between the support member and the retaining bracket; and a fastening member detachably fixed to the retaining bracket, the fastening member comprising a resilient member pressing the retaining bracket toward the support member, whereby the end portion is securely sandwiched between the support member and the retaining bracket.

9. The mounting apparatus assembly as described in claim 8, wherein the retaining bracket further comprises a main body covering the opening of the panel, and a pressing body extending from the main body, and the pressing body securely sandwiches the end portion with the support member.

10. The mounting apparatus assembly as described in claim 9, wherein the main body defines a pair of catch openings, the fastening member comprises a pair of spring members each having a catch at a free end thereof, and the spring members engage in the catch openings.

11. The mounting apparatus assembly as described in claim 8, wherein the main body defines a through opening, and the resilient member comprises a clip obliquely extending from the fastening member though the though opening to abut against the panel at the opening thereof.

12. The mounting apparatus assembly as described in claim 8, wherein a hole is defined in each of the support member and the pressing body, and the fastening member further comprises a fastening pin extending through the holes.

13. A mounting apparatus assembly comprising:

a rear panel defining an opening with a support plate extending from an lengthwise edge of the opening and perpendicular to said rear panel;

a plurality of slots defined in the rear panel under said support plate to receive slot covers;

a retaining bracket detachably attached to said rear panel and covering said opening, said bracket including a pressing body abutting against the support plate with tip portions of said slot covers sandwiched therebetween; and a fastening device fixed to said bracket, and comprising a resilient clip having a stepped pressing end pressing an opposite lengthwise edge of said opening, thereby pressing said bracket to said support plate.

14. The assembly as described in claim 13, wherein said fastening device is discrete from said bracket.

15. A mounting apparatus assembly comprising:

a rear panel defining opposite inner and outer sides thereof;

a support plate extending from the outer side of the rear panel and outwardly to an exterior and perpendicular to said rear panel;

a plurality of slots formed under said support plate to receive slot covers which are located on the inner side of the rear panel;

a retaining bracket detachably attached, from the outer side of said rear panel, to and located on the outer side of said rear panel with a pressing body abutting against the support plate with tip portions of said slot covers sandwiched therebetween; and a fastening device located at the outer side of the rear panel and fixing the bracket to at least one of said rear panel and said support plate; wherein the fastening device is detachably fastened to the retaining bracket, and one of said fastening device and said retaining bracket defines a fastening pin to prevent horizontal movements of both said fastening device and said retaining bracket relative to the support plate, and said fastening device further defines a resilient clip releasably engaged with the rear panel to not only prevent upwardly vertical movement of both said fastening device and said retaining bracket relative to the rear panel but also exert a downward force to press the retaining bracket toward the support plate for tightly sandwiching the slot cover therebetween.

16. The assembly as described in claim 15, wherein said support plate is integrally formed with the rear panel.

17. The assembly as described in claim 15, wherein said slots are formed in the rear panel.

18. The assembly as described in claim 15, wherein said fastening device is discrete from the bracket.

* * * * *